United States Patent [19]

Mueller

[11] Patent Number: 4,647,868
[45] Date of Patent: Mar. 3, 1987

[54] PUSH-PULL RADIO-FREQUENCY POWER SPLITTER/COMBINER APPARATUS

[75] Inventor: Otward M. Mueller, Ballston Lake, N.Y.

[73] Assignee: General Electric Company, Schenectady, N.Y.

[21] Appl. No.: 715,991

[22] Filed: Mar. 25, 1985

[51] Int. Cl.$^4$ .......................... H03F 3/60; H03H 7/48
[52] U.S. Cl. .................................. 330/286; 330/295; 330/124 R; 333/117; 333/119; 333/124; 333/136; 333/25
[58] Field of Search ............... 333/124, 125, 127, 117, 333/119, 136, 100, 26, 112, 25, 109; 330/286, 295, 53, 55, 124 R

[56] References Cited

U.S. PATENT DOCUMENTS

| | | | |
|---|---|---|---|
| 3,103,638 | 9/1963 | Greuet | 333/127 |
| 3,181,087 | 4/1965 | Almering | 333/119 |
| 3,735,289 | 5/1973 | Bruene | 333/26 X |
| 4,121,180 | 10/1978 | Greenway | 333/112 |

OTHER PUBLICATIONS

Basset, Raymond; "Three Balun Designs for Push–Pull Amplifiers"; *Microwaves;* vol. 19, No. 7, Jul. 1980; pp. 47–52.
AN-749, "Broadband Transformers and Power Combining Techniques for RF", H. Granburg, in Motorola RF Data Manual, 3rd Ed., 1983, pp. 4–145 to 4–153.
MRF154 Data Sheet, FIG. 5, Motorola Semiconductors, 1985.

*Primary Examiner*—Eugene R. LaRoche
*Assistant Examiner*—Benny Lee
*Attorney, Agent, or Firm*—Geoffrey H. Krauss; James C. Davis, Jr.; Marvin Snyder

[57] ABSTRACT

A four-way power splitter/combiner apparatus comprises five unbalanced ports, configured as a common port and four other ports, with power introduced into the common port, over a relative wide frequency band, being substantially equally divided between the four other ports, and vice versa. Each of the first and second ports of each pair of the four other ports has a substantially in-phase signal thereat, with the first in-phase pair of ports having a substantially 180° signal phase difference from the substantially in-phase signals at the other pair of ports. Each of the balun and 2-to-1 transformers of the push-pull 4-port apparatus can be fabricated of a magnetically-decoupled coaxial cable assembly, wherein the cables are all of the same characteristic impedance as the load impedance magnitude at each of the five ports.

22 Claims, 9 Drawing Figures

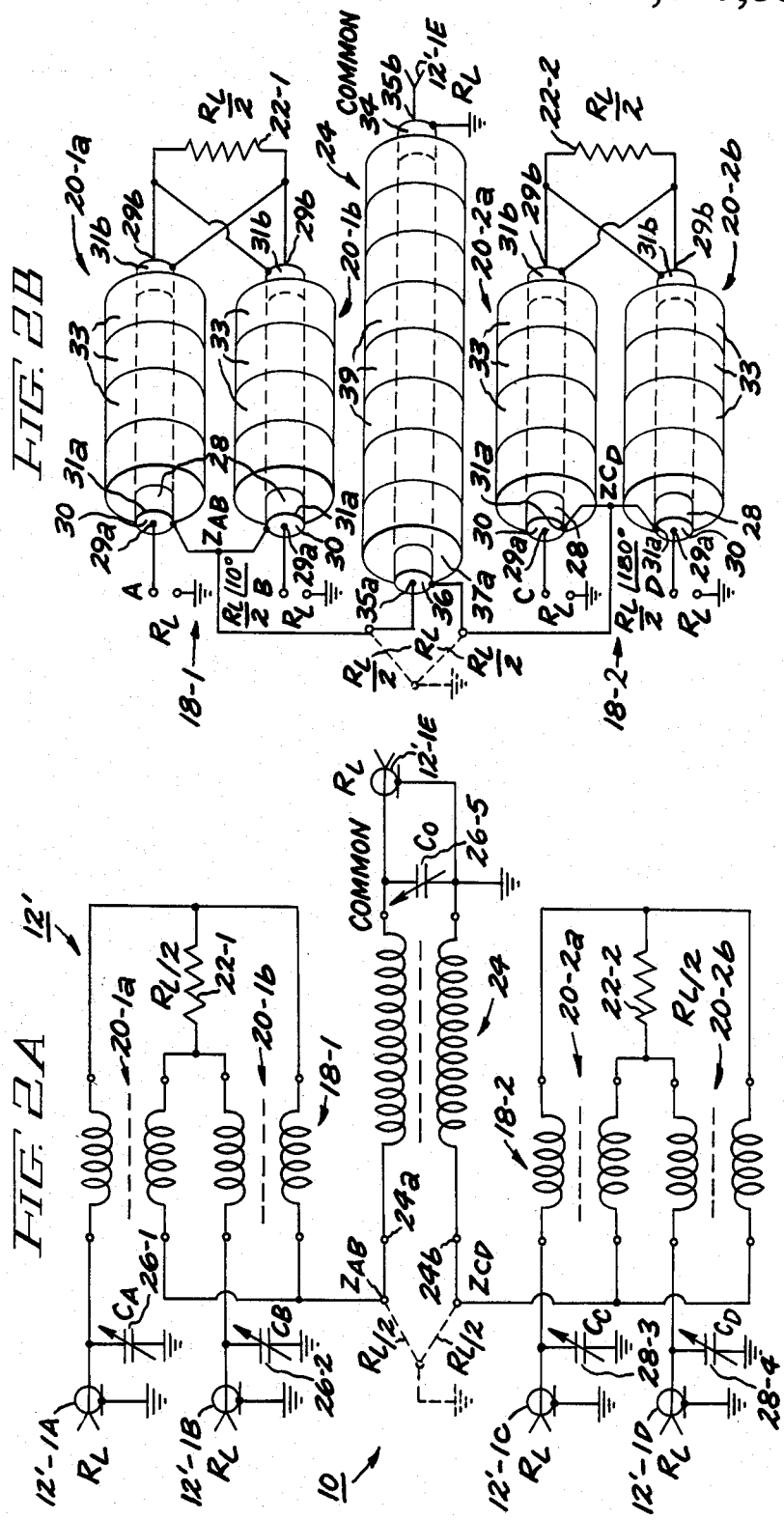

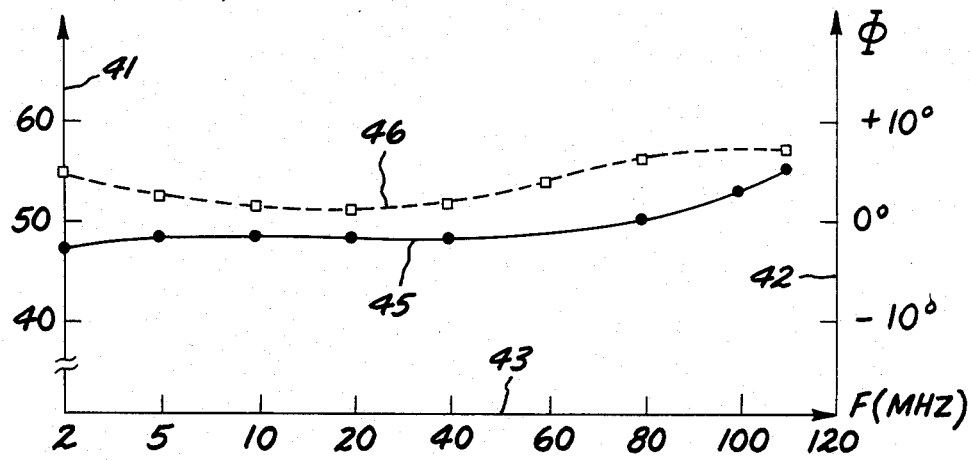
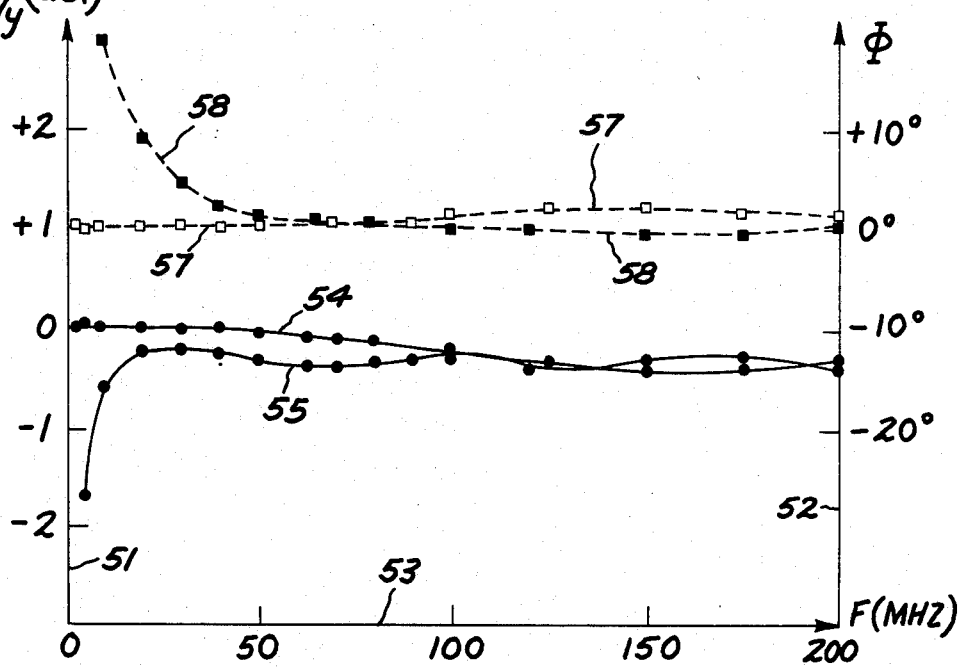

PUSH-PULL RADIO-FREQUENCY POWER SPLITTER/COMBINER APPARATUS

BACKGROUND OF THE INVENTION

The present invention relates to passive radio-frequency circuitry and, more particularly, to a novel radio-frequency (RF) four-way power splitter/combiner apparatus operating in a push-pull mode.

In many high-power RF applications, such as magnetic resonance imaging and the like, vacuum tube amplifiers are utilized to provide the relatively high RF excitation energy needed. However, solid-state devices capable of generating RF power outputs of the required magnitude are available at lower RF frequencies, and are expected to be shortly available at RF frequencies in the lower VHF region; use of solid-state power amplifiers is highly desirable, to provide the desired excitation signal: with larger bandwidth; over a longer lifetime (higher reliability); require simpler cooling systems; and cost less. At present, providing even a high-frequency RF power amplifier with significant, e.g. greater than several hundred watts, power output requires that the output of several individual power amplifier modules, each capable of providing only a portion of the required output power, be combined. The input power for the plurality of amplifier modules must itself be provided by splitting a common input signal. Accordingly, it is highly desirable to provide apparatus having a common terminal and four other terminals, a first pair of which is at a 180° phase difference from a second pair of other terminals, and with the four-way apparatus being utilizable for either a power-splitting function, i.e. wherein the common port receives input power and the four ports each provide approximately one-fourth of the input power as driving power to an associated input of a different power amplifier, or as a power combiner, i.e. wherein the output power received at each of the four other ports is combined into a signal at the common output port.

It is well known in the prior art to provide four-way splitter/combiner apparatus utilizing broadband transformers in which coaxial lines of severel different characteristic impedances, e.g. 25 and 50 ohm lines, are utilized with 4:1 impedance transformers, to provide four other port signals all having the same phase angle responsive to a single signal at the common port. Typical prior art configurations can be found in Application Note AN-749, entitled "Broadband Transformers and Power Combining Techniques for RF", in the *Motorola RF Data Manual* (1980) at pages 2-67 and 2-68.

BRIEF SUMMARY OF THE INVENTION

In accordance with the invention, a four-way power splitter/combiner apparatus comprises five coaxial (unbalanced) ports, configured as a common port and four other ports, with power introduced into the common port, over a relatively wide frequency band, being substantially equally divided between the four other ports, with each of first and second pairs of ports having 180° phase difference between the pairs and with a first one of each pair of the other ports having a 0° signal phase difference from the remaining one of that port pair.

In presently preferred embodiments, coaxial cables of only the normal system impedance, e.g. 50 ohms, are utilized; three or five ferrite-loaded transformation sections are used to provide each push-pull four-way power splitter/combiner apparatus.

Accordingly, it is one object of the present invention to provide a novel five-port four-way power splitter/combiner apparatus having each of two pairs of other ports separated by substantially 180° phase difference and operating in the push-pull mode.

This and other objects of the present invention will become apparent upon reading of the following detailed description of the invention, when considered in conjunction with the drawings.

BRIEF SUMMARY OF THE DRAWINGS

FIG. 2A is a schematic diagram of a first presently preferred embodiment of four-way push-pull power splitter/combiner apparatus in accordance with the present invention;

FIG. 2B is a somewhat schematic illustration of a coaxial implementation of the circuit of FIG. 2A;

FIGS. 2C and 2D are graphs illustrating the common port impedance magnitude and phase, and the voltage ratios and phases between various ones of the four other ports;

DETAILED DESCRIPTION OF THE INVENTION

Figure 1:
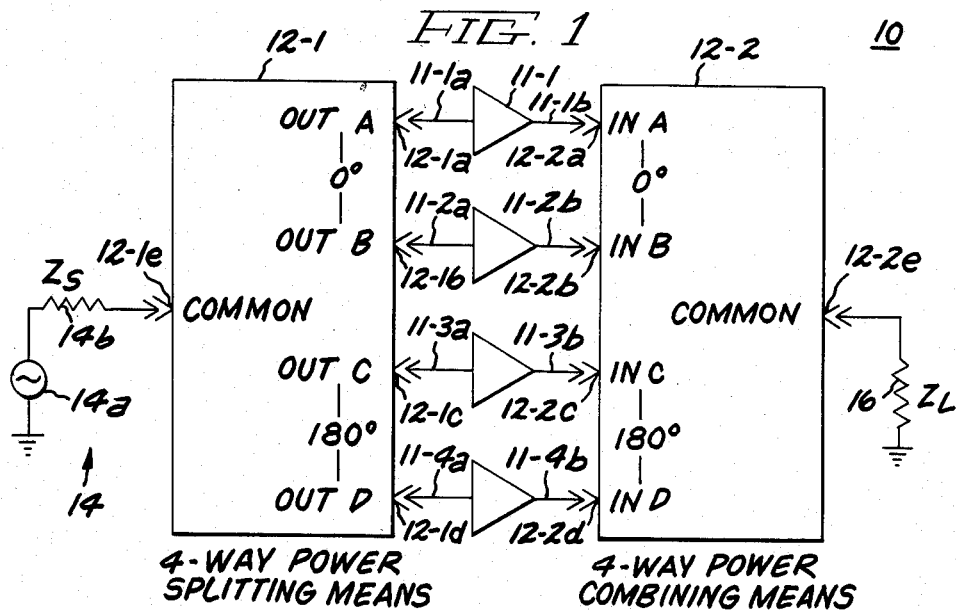
FIG. 1 is a schematic block diagram of a power amplifier utilizing a plurality of amplifier modules and four-way splitting/combining apparatus in accordance with the present invention for providing driving power to the modules and for combining the output power thereof.

Referring initially to FIG. 1, an illustrative high-power RF amplifier 10 contains a plurality of amplifier modules (labelled with a reference designation beginning with the number 11) and a plurality of power splitting/combining means (labelled with a reference designation beginning with the number 12), for amplifying the power output of an RF source 14, and providing the amplified power signal to a load 16. In the particular illustrated configuration, four power modules 11-1 through 11-4 are utilized, along with a pair of power splitting/combining means 12-1 and 12-2. Each of amplifier modules 11-1 through 11-4 has an associated RF signal input 11-1*a* through 11-4*a* and an associated RF signal output 11-1*b* through 11-4*b*. Each of signal inputs 11-1*a* through 11-4*a* is connected to one of a like number of a plurality of splitting/combining means ports 12-1*a* through 12-1*d*, respectively, of first means 12-1, herein operating as a power splitting means. Similarly, each respective power amplifier module output 11-1*b* through 11-4*b* is individually connected to an associated one of the respective four ports 12-2*a* through 12-2*d* of the second power means 12-2, herein operating as a power combining means. The four ports 12-1*a* through 12-1*d* of power splitting means 12-1 can be considered as outputs A–D (or OUT A through OUT D), while the four ports 12-2*a* through 12-2*d* of power combining means 12-2 can be considered as inputs A–D (or IN A through IN D). Each of means 12 has a common RF port, e.g. common port 12-1e of the power splitting means and common port 12-2e of the power combining means. For purposes of description, each of ports 12-1a through 12-1d or 12-2a through 12-2d will be hereinafter referred to as a 4-port, and ports 12-1e and 12-2e will be referred to as a common port.

In accordance with one aspect of the present invention, the 4-ports are paired, with each pair of 4-ports, e.g. the pair of 4-ports port A and B or the pair of 4-ports C and D, having identical phase, e.g. a phase of about 0°, or about 180°, respectively, with respect to a signal at the common port; each pair of 4-ports thus has a phase difference of about 180° with respect to the other pair of 4-ports. Each 4-port provides a splitting/combining ratio of about 0 dB. with respect to the other 4-port of that pair; each pair has about a 0 dB. ratio with respect to the other pair. Thus, one pair of 4-ports, e.g. ports A and B, forms a push-pull configuration with the other pair of 4-ports, e.g. ports C and D. This provides the additional beneficial features normally obtained from push-pull amplifier operation, such as suppression of even harmonics of the operating RF frequency, and the like.

Referring now to FIGS. 2A and 2B, a first presently preferred embodiment of a four-way power splitting/combining means 12, having two pair of 4-ports, with each pair in phase opposition to the other pair, is illustrated. Four-way apparatus 12' comprises first and second three-port hybrid circuits 18-1 and 18-2 each comprised of a pair of transmission line transformers 20-1a and 20-1b, or 20-2a and 20-2b, respectively, and an isolation resistance element 22-1 or 22-2, respectively. Coaxial balanced-to-unbalanced, or balun, transformer 24 is connected between the pair of three-port hybrid circuits 18-1 and 18-2 and the apparatus common port 12'-1e. Each of the apparatus 4-ports 12'-1A through 12'-1D and the common port 12'-1E are designed for optimum operation with the same load resistance $R_L$, which is typically equal to the magnitude of the impedance of coaxial cables utilized within the system, e.g. 50 ohms and the like. In addition to the pair of hybrid circuits 18-1 and 18-2 and the transmission line balun 24, a variable capacitance (labelled with a reference designation beginning with the number 26) is typically provided in shunt with each port, to allow any residual inductive impedance component to be compensated for. Thus, the 0° 4-ports 12'-1A and 12'-1B of the first hybrid circuit 18-1 are respectively provided with variable capacitive elements 26-1 and 26-2, settable to capacitive values $C_A$ and $C_B$, respectively. The 180° 4-ports 12'-1C and 12'-1D of the second hybrid circuit 18-2 are respectively provided with variable capacitive elements 26-3 and 26-4, settable to capacitive values $C_C$ and $C_D$ respectively. The output of each hybrid circuit 18-1 or 18-2, at the terminals labeled $Z_{AB}$ and $Z_{CD}$ respectively, has an effective unbalanced impedance substantially equal, in magnitude, to one-half the characteristic impedance, i.e. equal to $(R_L/2)$, with respect to circuit ground potential. Each of outputs $Z_{AB}$ and $Z_{CD}$ has a phase of 180° with respect to the other. Therefore, the impedances add and the total impedance between terminals 24a and 24b is a balanced impedance of $R_L$ ohms. This balanced impedance is converted, by transmission line balun 24, to an unbalanced impedance of magnitude $R_L$, at common port 12'-1E. Any residual inductive impedance component at this common port is compensated for by variable capacitance 26-5, having an output capacitor value $C_o$.

Each of transmission line transformers 20-1a, 20-1b, 20-2a and 20-2b is constructed of a length of a coaxial cable 28, having an impedance $Z_O$ equal to the splitter/combiner apparatus load impedance $R_L$ value. Each coaxial transmission line 28 has a center conductor, having a first end 29a connected to the associated one of the four 4-ports, and having an opposite end 29b, connected to one end of the associated isolation resistor 22-1 or 22-2. A cylindrical sheath 30 of insulation dielectric material surrounds each center conductor, and is itself surrounded by a coaxial outer conductor. The coaxial outer conductor ends 31a, closest to the inner conductor ends connected to the associated 4-port, are connected together to form the respective transmission line transformer output terminal $Z_{AB}$ and $Z_{CD}$. The opposite end 31b of each coaxial cable is cross-connected to the center conductor end 29b of the opposite coaxial cable of that transmission line transformer 20 and, therefore, to an end of the associated isolation resistance 22. A plurality of magnetic decoupling elements 33, such as ferrite beads, cores, tubes and the like, generally having a toroidal shape, are placed about the outer conductor 31 of each transmission line assembly 20. Each of the transmission lines 28 is of a length, between opposite center conductor ends 29a and 29b, which is less than one-quarter of an effective wavelength at the maximum frequency of apparatus operation. Each of the ferrite decoupling elements 33 is chosen such that, when the desired number of such elements 33 are "strung" upon the associated coaxial element 28, the impedance measured between at least the outer conductor input and output ends 31a and 31b is relatively high in comparison to, e.g. at least an order of magnitude greater than, the characteristic impedance $Z_O$ of the coaxial cable 28 at the lowest frequency of desired operation. The decoupling elements, in each transformer described herein, act to minimize common-mode RF currents in the associated transformer.

The balun transformer 24 is fabricated of a length of coaxial cable 34 having a characteristic impedance $Z_O$ equal to the apparatus port impedance $R_L$. Coaxial cable 34 has a center conductor, having an input end 35a connected to the output of the first hybrid circuit means 18-1 and having an opposite end 35b connected to common connector 12-1E. A generally cylindrical member 36 of dielectric insulation material surrounds the center conductor, and is itself surrounded by a cylindrical outer conductor. That outer conductive sheath end 37a closest to center conductor end 35a is connected to the output of the second hybrid circuit means 18-2, while the opposite outer conductor end 37b is connected to system RF common potential at the common port end. The coaxial cable 34 of the balun transformer 24 is placed through the central apertures of another plurality of magnetic decoupling (ferrite) elements 39. Cable 34 can be run in a generally linear fashion through the plurality of ferrite elements 39, or may be wound about a single large ferrite element. Cables 28 can similarly be run through, or wound about, element 33. At power levels on the order of 1–10 kilowatts, at frequencies in the low VHF region (e.g. frequencies from about 30 MHz. to about 100 MHz.), the ferrite elements 33 and/or 39 may exhibit a rise in temperature due to dissipation of RF power caused by unavoidable common mode currents and other unsymmetrical parameters. As approximately twice the power in each of hybrid circuit means 18 is present in transmission line balun 24, I generally prefer to make transmission balun line 24 of about twice the length of each of the transformer lines 20, and to use about twice as many ferrite elements 39 as elements 33, so that the losses per ferrite element are not increased in the transmission line balun. It will be understood that the actual form of coaxial cables 28 and 34, the particular materials and forms of elements 33 and 39, and the power ratings and configurations for isolation resistances 22, can all be selected from a wide range of readily-available, custom-available or custom-built components as necessary for the particular impedance and/or power levels and frequencies involved in a particular application of my novel 4-port push-pull power splitter/combiner apparatus.

Referring now to FIG. 2C, the common port impedance vs. frequency response, of one splitter/combiner apparatus of this embodiment type, is illustrated. The magnitude of the 50 ohm-nominal common impedance is plotted along ordinate 41, for values between 40 ohms and 60 ohms, while the 0°-nominal phase, is plotted along auxiliary ordinate 42, for values between $-10°$ and $+10°$, with respect to frequencies between about 2 MHz. and about 110 MHz. plotted along abscissa 43. Solid curve 45 is the impedance magnitude curve, read in conjunction with ordinate 41, while broken-line curve 46 is the common port phase curve, read with respect to auxiliary ordinate 42. Both curves are plotted for the condition wherein each of the four ports is terminated with a low-reflectivity load of characteristic impedance, e.g. about $50\pm j0$ ohms. It will be seen that a common port VSWR of less than 1.1:1 and a total phase change of less than 6° occurs over the entire range between about 2 MHz. and about 110 MHz.

Referring now to FIG. 2D, a 4-port voltage ratio, which I call a $V_x/V_y$ ratio, in decibels dB., is plotted along ordinate 51 and a 4-port pair-to-pair phase difference $\Phi$ (which is "normalized" to zero by the addition of a 180° offset to the actual phase difference) is plotted along auxiliary ordinate 52, for frequencies plotted along abscissa 53. Curve 54, to be read with respect to ordinate 51, illustrates the change in the ratio of the voltage at 4-port A with respect to that at in-phase 4-port B (the ratio between the 0° pair of 4-ports). Curve 55, also read with respect to ordinate 51, is the ratio of the voltage at one of the 180° 4-ports (4-port C) to that at one of the 0° 4-ports (4-port B). It will be seen that the in-phase 4-port signal amplitudes are within one-half of a decibel of each other over an extremely large frequency range, and that the push-pull voltage ratio (curve 55) is within about $\pm 0.3$ dB. over a frequency range from less than 2 MHz. to in excess of 200 MHz. The phase between the 0° 4-ports A and B is, as shown by curve 57, within less than $\pm 2°$ over the full frequency range, while the phase difference $\Phi$ (again normalized to zero by the addition of 180°) between 4-ports B and C is, as shown by curve 58, within about $\pm 3°$ over a relatively wide frequency range (e.g. from about 20 MHz. to greater than 200 MHz.) and is within $\pm 5°$ over an even larger frequency range.

Figure 3B:
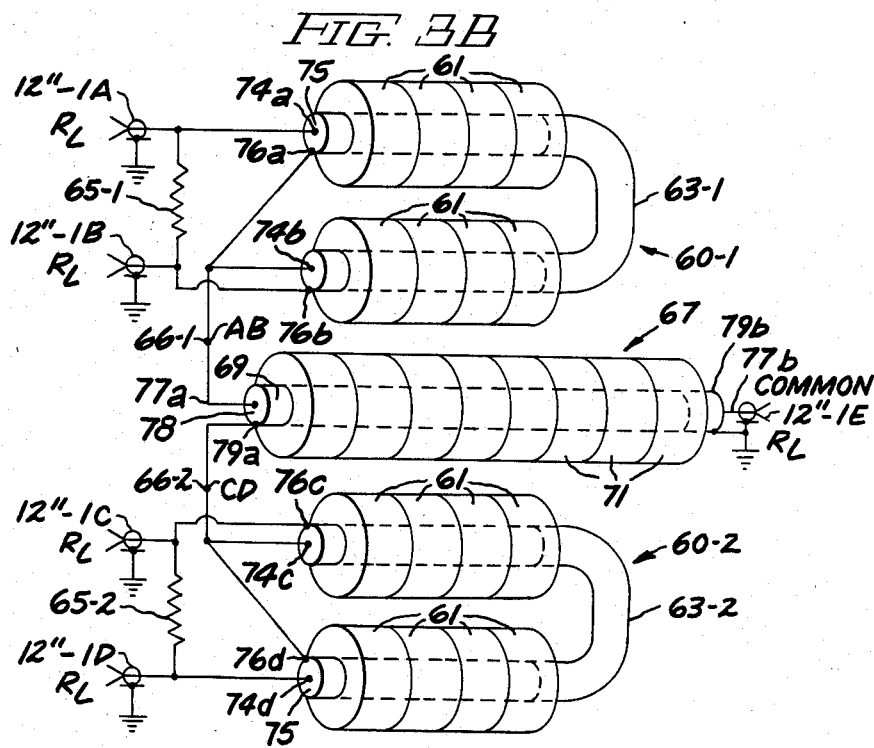
FIG. 3B is another schematic illustration of a coaxial implementation of the circuit of FIG. 3A.
Figure 3A:
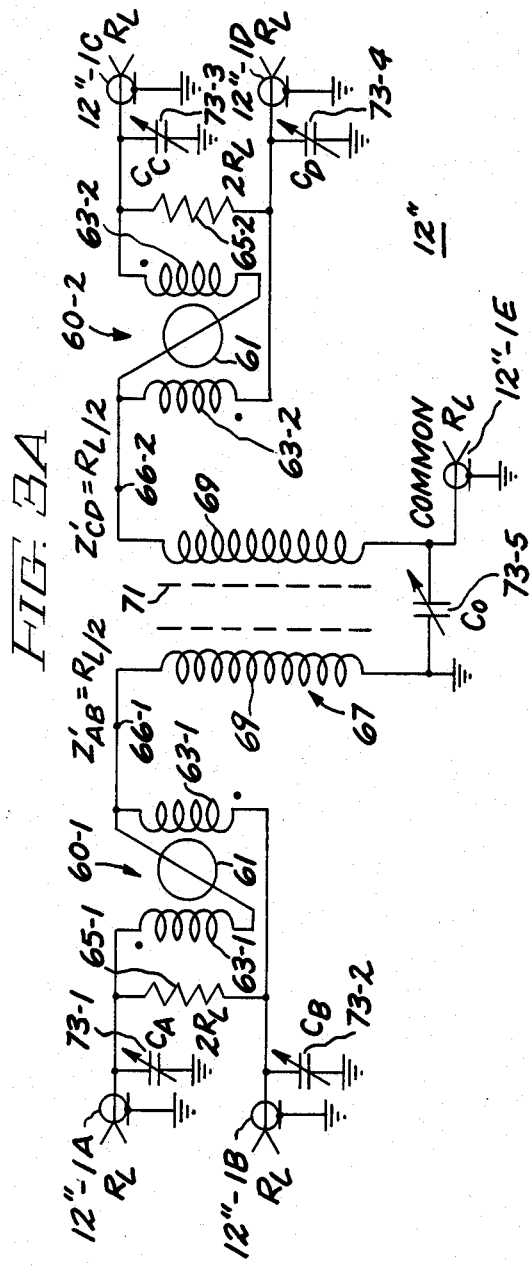
FIG. 3A is another presently preferred embodiment of four-way push-pull power splitter/combiner apparatus in accordance with the present invention.

Referring now to FIGS. 3A and 3B, the five-cable embodiments 12 and 12' can be replaced by another presently preferred embodiment 12", which requires only three coaxial cable assemblies. Splitter/combiner apparatus 12" utilizes a first coaxial transformer means 60-1 for combining the in-phase power provided at first and second input 4-ports 12"-1A and 12"-1B each providing, and operating with, a terminating impedance $R_L$ equal to the characteristic impedance of the coaxial members forming the various transformation means. A second transformer means 60-2 combines the in-phase power provided to another pair of 4-ports 12"-1C and 12"-1D. Each of transformer means 60-1 and 60-2 utilizes at least one magnetic member 61 through which, or about which, are wound transformer means windings 63-1 or 63-2, respectively. A resistive element 65-1 or 65-2, respectively, for absorbing unbalanced dissipative powers, is respectively connected between 4-ports 12"-1A and 12"-1B, or 12"-1C and 12"-1D; each of balance resistances 65-1 and 65-2 are of resistance substantially equal to twice the port termination resistance $R_L$. The transformation means 60-1 and 60-2 provide respective unbalanced output terminal 66-1 and 66-2 impedances $Z'_{AB}$ and $Z'_{CD}$; each output impedance is of a magnitude of one-half the common port termination value, i.e. a magnitude $R_L/2$, with respect to circuit RF common potential, and is 180° out-of-phase with the other output terminal. Thus, a balanced impedance is provided between transformation means output terminals 66-1 and 66-2. The balanced impedance is of magnitude substantially equal to $R_L$, and is present at the input of a balun transformer means 67. Transformer means 67 includes "windings" 69 about magnetic means 71. The unbalanced side of balun transformation means 67 is connected between common port 12"-1E and RF ground potential. Preferably, a variable capacitance element 73-1 through 73-5 is provided in parallel with each of apparatus ports 12"-1A through 12"-1E, to provide an associated capacitance of magnitude $C_A$ through $C_D$ and $C_o$, respectively, to substantially compensate residual inductive reactance at the associated apparatus port.

As seen in FIG. 3B, I prefer to realize the pair of 2-to-1 impedance transformer means 60-1 and 60-2 with each transformer means having a single coaxial cable 63-1 or 63-2. In the first transformation means 60-1, the first end 74a of a center conductor is connected to 4-port 12"-1A and one end of resistance 65-1, while the other center conductor end 74b is connected to the transformation means output 66-1. The center conductor is surrounded by insulative dielectric material 75 and has an outer conductive sheath having a first end 76a, adjacent to first center conductor end 74a, which is connected to second center conductor end 74b and the output 66-1. The opposite outer conductor end 76b, adjacent to second center conductor end 74b, is connected to second 4-port 12"-1B and the remaining end of resistance 65-1. In the second transformation means 60-2, the first end 74c of the center conductor is connected to output 66-2. The center conductor second end 74d is connected to second 4-port 12"-1D and the one end of resistance 65-2. The center conductor is surrounded by insulative dielectric material 75 and has an outer conductive sheath having a first end 76c, adjacent to first center conductor end 74c, which is connected to the remaining 4-port 12"-1c and the remaining end of resistance 65-2. The second outer conductor end 76d, adjacent to second center conductor end 74d, is connected to first center conductor end 74c and the second transformer output 66-2. A plurality of ferrite elements 61 enclose each of cable 63-1 and 63-2.

Balun transformer means 67 utilizes a single coaxial cable 69, having a first center conductor end 77a connected to the output 66-1 of the first impedance transformer means 60-1 and having the center conductor second end 77b connected to common output connection means 12"-1E. The center conductor is supported by insulative dielectric material 78 within a tubular outer conductor having a first end 79a connected to the second transformation means output 66-2 and a second end 79b connected to RF common potential adjacent to common port connection means 12"-1E. A plurality of ferrite decoupling elements 71 encloses the coaxial cable 69.

Figure 3C:
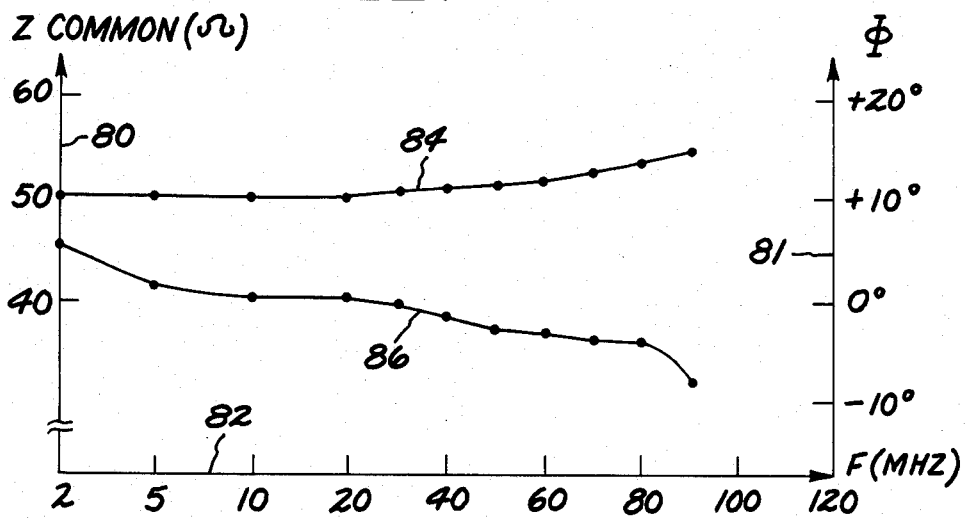
FIG. 3C and 3D are graphs illustrating the common port impedance magnitude and phase, and the voltage ratios and phases between various ones of the four other ports.

Referring now to FIG. 3C, the common port impedance vs. frequency response of one splitter/combiner apparatus of this embodiment type is illustrated. The magnitude of the 50 ohm-nominal common impedance is plotted along ordinate 80, for values between 40 ohms and 60 ohms, while the 0°-nominal phase is plotted along auxiliary ordinate 81, for values between −10° and =10°, with respect to frequencies between about 2 MHz. and about 90 MHz. plotted along abscissa 82. Upper curve 84 is the impedance magnitude curve, read in conjunction with ordinate 80, while lower curve 86 is the common-port phase curve, read with respect to auxiliary ordinate 81. Both curves are plotted for the condition wherein each of the four other ports is terminated with a low-reflectivity load of characteristic impedance, e.g. about 50±j0 ohms. It will be seen that a common port VSWR of less than about 1.1:1 and a total phase change of less than about 10° occurs over the multi-octave frequency range between about 5 MHz. and about 80 MHz., with a somewhat greater total phase change occurring over the entire range between about 2 MHz. and about 90 MHz.

Figure 3D:
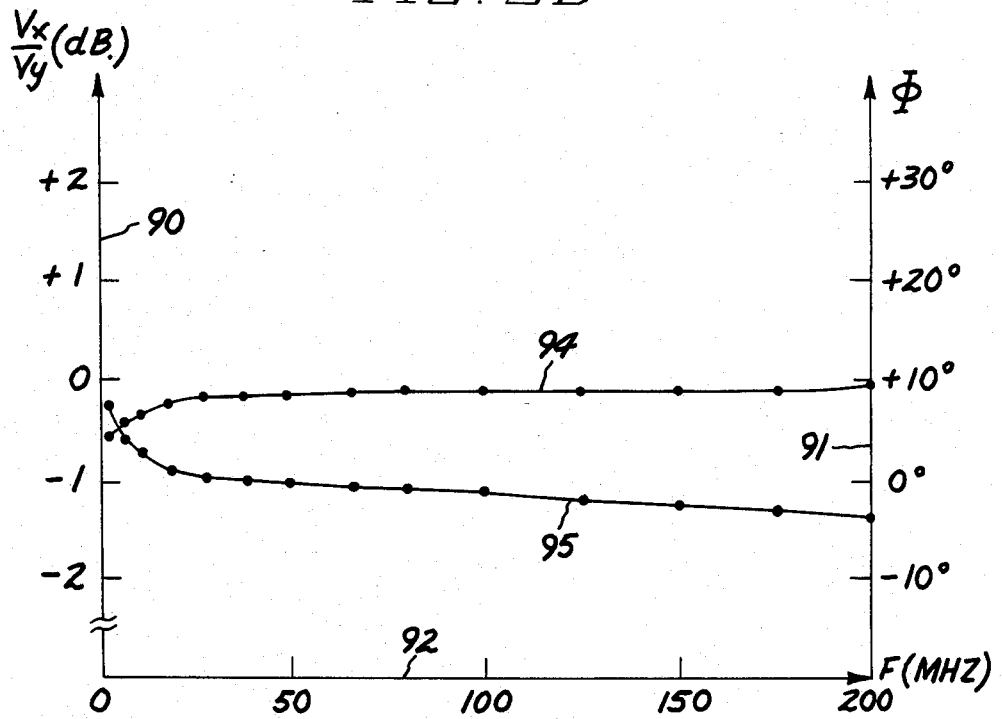

Referring now to FIG. 3D, a 4-port voltage $V_x/V_y$ ratio, in decibels dB., is plotted along ordinate 90 and a 4-port pair-to-pair phase difference $\Phi$ (+180°) is plotted along auxiliary ordinate 91, for frequencies plotted along abscissa 92. Curve 94, to be read with respect to ordinate 90, illustrates the change in the ratio of the voltage at 4-port D with respect to that at the out-of-phase 4-port A (the ratio between a 180° pair of 4-ports.). It will be seen that the push-pull voltage ratio, of curve 94, is within about 0.3 dB. over a frequency range from less than 2 MHz. to at least 200 MHz. The phase difference (normalized to zero by the addition of +180°) is represented by the quantity $\phi$ between out-of-phase 4-ports B and C is, as shown by curve 95, within about ±3° over a relatively wide frequency range (e.g. from about 10 MHz. to at least 200 MHz.) and is within ±8° over an even larger frequency range.

Accordingly, a wide-band 4-port splitter/combiner apparatus can be provided with a single balanced transformer and a pair of 2-port combining transformation means, to realize a relatively simple and physically compact 4-way power splitting/combining apparatus having first and second pairs of ports, with the two ports in each pair being substantially in-phase with one another and with each port pair being substantially 180° out-of-phase with the opposite port pair, i.e. operating in a push-pull mode.

While several presently preferred embodiments of my novel push-pull 4-port power splitting/combining apparatus are described in detail herein, many variations and modifications will now become apparent to those skilled in the art. It is my intent, therefore, to be limited only by the scope of the impending claims and not by way of the specific details and instrumentalities provided herein as illustrative of presently preferred embodiments.

What I claim is:

1. Push-pull radio-frequency signal apparatus, comprising:
    means for providing a common signal port;
    means for providing first, second, third and fourth other signal ports each substantially at a port resistance $R_L$;
    only first and second three-port hybrid means, the first hybrid means for transforming the port resistance of a first respective port pair, comprised of said first and second ports, to an output resistance of magnitude substantially equal to ($R_L/2$), the second hybrid means for transforming the port resistance of a second port pair, comprised of said third and fourth ports, to an output resistance of magnitude substantially equal to ($R_L/2$), and with the first hybrid means output resistance in effective series connection with the output resistance of the second hybrid means; and
    a single balun means for transforming the series-connected output resistance of the first and second hybrid means directly to an unbalanced resistance of magnitude substantially equal to $R_L$ at said common port means; said balun means and both of said hybrid means cooperating to cause the power of an RF signal, introduced in said common port, to be divided into four portions, each different portion being of substantially the same amplitude at an associated one of the four other ports, with the phase of the signals at said first pair of ports being in-phase with one another, the phase of the signals at said second pair of ports being in-phase with one another, and the phase of the signals at the first port pair being substantially of opposite (180°) phase from the phase of the signals at the second port pair.

2. The apparatus of claim 1, wherein said apparatus has at least an octave bandwidth.

3. The apparatus of claim 2, wherein the amplitude of the signals at said first through fourth other ports are within ±0.5 dB. of one another across said bandwidth.

4. The apparatus of claim 2, wherein the phase of the signals at each one of the ports of each of said first and second port pairs is within ±5° of the one of the other ports of that pair across said bandwidth, and the phase between said first and second port pairs is within 180° ±5° across said bandwidth.

5. The apparatus of claim 1, wherein said apparatus has at least a decade bandwidth.

6. The apparatus of claim 2, wherein the amplitude of the signals at said first through fourth other ports are within ±1 dB. of one another across said bandwidth.

7. The apparatus of claim 2, wherein the phase of the signals at each of the ports of each of first and second port pairs is within ±10° of the other one of the ports of that pair across said bandwidth, and the phase between said first and second port pairs is within 180°±10° across said bandwidth.

8. The apparatus of claim 1, wherein each of said first and second hybrid means comprises: a transmission line transformer having a first input connected to a first one of the two ports of the respective associated port pair and a second input connected to the remaining one of the two ports of that pair, and an output at which said output resistance of magnitude substantially to ($R_L/2$) appears if the first and second inputs are terminated with said port resistance $R_L$; and means for isolating the first port of the port pair from the second one of the ports of that pair, if the port resistance $R_L$ is removed from at least one of the first and second ports of that pair.

9. The apparatus of claim 8, wherein each transmission line transformer includes at least one coaxial cable.

10. The apparatus of claim 9, wherein each of said transmission line transformers comprises a single U-shaped coaxial cable, having a center conductor with first and second opposed ends, the first end being connected to a first one of the ports of the associated port pair, and the second end being connected to the transformer output, said cable having an outer conductor dielectrically spaced from said center conductor and having first and second opposed ends each respectively adjacent to the like one of the first and second ends of the center conductor, the first end of said outer conductor being connected to the second end of the center conductor and said transformer output, the second outer conductor end being connected to the remaining port of the associated port pair; and said isolation means comprises a resistance connected between the first one and the second one of the ports of said port pair.

11. The apparatus of claim 10, wherein the isolation resistance has a magnitude substantially equal to 2 $R_L$.

12. The apparatus of claim 10, wherein each coaxial cable has a characteristic impedance substantially equal to the port resistance $R_L$.

13. The apparatus of claim 12, wherein the cable characteristic impedance is substantially equal to 50 ohms.

14. The apparatus of claim 10, further comprising means for minimizing the magnitude of common mode RF signals flowing through said coaxial cables.

15. The apparatus of claim 14, wherein said minimizing means comprises at least one ferrite bead, each having an aperture therethrough, through which aperture at least one of the coaxial cables of the apparatus is passed, each ferrite bead having an impedance at least an order of magnitude greater than the characteristic impedance of the coaxial cable, at all frequencies within the useful bandwidth of said apparatus.

16. The apparatus of claim 9, wherein each transmission line transformer includes first and second coaxial cables, each having a center conductor having first and second opposed ends and each having an outer conductor dielectrically spaced from said center conductor and having first and second opposed ends each respectively adjacent to the like one of the first and second center conductor ends, said first end of each cable center conductor being connected to an associated different one of the associated pair of ports, both of the first ends of said outer conductors being connected together to form the output of said transformer, and the second end of each outer conductor respectively of said first and second cables being cross-connected to the respective second end of each of the second and first center conductors; and said isolation means comprises a resistance connected between the second ends of the center conductors of said first and second coaxial cables.

17. The apparatus of claim 16, wherein the isolation resistance has a magnitude substantially equal to ($R_L/2$).

18. The apparatus of claim 16, wherein each coaxial cable has a characteristic impedance substantially equal to the port resistance $R_L$.

19. The apparatus of claim 18, wherein the cable characteristic impedance is substantially equal to 50 ohms.

20. The apparatus of claim 16, further comprising means for minimizing the magnitude of common mode RF signals flowing through said coaxial cables.

21. The apparatus of claim 20, wherein said minimizing means comprises at least one ferrite bead, each having an aperture therethrough, through which aperture at least one of the coaxial cables of the apparatus is passed, each ferrite bead having an impedance at least an order of magnitude greater than the characteristic impedance of the coaxial cable, at all frequencies within the useful bandwidth of said apparatus.

22. In combination:

push-pull radio-frequency power splitter apparatus comprising: means for providing a common signal input port; means for providing first, second, third and forth signal output ports each substantially at a port resistance $R_L$; only first and second three-port hybrid means, the first hybrid means for transforming the port resistance of a first respective port pair, comprised of said first and second output ports, to a transformed resistance of magnitude substantially equal to ($R_L/2$), the second hybrid means for transforming the port resistance of a second port pair, comprised of said third and fourth output ports, to a transformed resistance of magnitude substantially equal to ($R_L/2$), and with the first hybrid means transformed resistance in effective series connection with the transformed resistance of the second hybrid means; and a single balun means for transforming the series-connected transformed resistances of the first and second hybrid means directly to an unbalanced resistance of magnitude substantially equal to $R_L$ at said common input port means; said balun means and both of said hybrid means cooperating to cause the power of an RF signal, introduced into said common input port, to be divided into four portions, each different portion being of substantially the same amplitude at an associated one of the four output ports, with the phase of the signals at said first pair of ports being in-phase with one another, the phase of the signals at said second pair of ports being in phase with one another, and the phase of the signals at the first port pair being of substantially of opposite (180°) phase from the phase of the signals at the second port pair;

push-pull radio-frequency power combiner apparatus, comprising: means for providing a common signal output port; means for providing first, second, third and fourth signal input ports each substantially at a port resistance $R_L$; only first and second three-port hybrid means, the first hybrid means for transforming the port resistance of a first respective port pair, comprised of said first and second input ports, to a transformed resistance of magnitude substantially equal to ($R_L/2$), the second hybrid means for transforming the port resistance of a second input pair, comprised of said third and fourth input ports, to a transformed resistance of magnitude substantially equal to ($R_L/2$), and with the first hybrid means transformed resistance in effective series connection with the transformed resistance of the second hybrid means; and a single balun means for transforming the series-connected transformed resistances of the first and second hybrid means directly to an unbalanced resistance of magnitude substantially equal to $R_L$ at said common output port means; said balun means and both of said hybrid means cooperating to combine the power of four different RF signal portions, each of substantially the same amplitude at an associated one of the four input ports, with the phase of the signals at said first pair of input ports being in-phase with one another, the phase of the signals at said second pair of input ports being in-phase with one another, and the phase of the signals in the first input port pair being of substantially of opposite (180°) phase from the phase of the signals at the second input pair, into a single common output port signal; and four RF amplifiers each having an input and an output and substantially common characteristics;

the input of each of said amplifiers being connected to a different one of the output ports of the splitter apparatus, the common input port of said splitter apparatus being a single common input for the combination; and the output of each of the four amplifiers being connected to a differenct one of the four input ports of the combiner apparatus, the combiner apparatus common output port forming a common single output of the combination.

* * * * *